United States Patent [19]

Fulkerson

[11] 3,891,480

[45] June 24, 1975

[54] BIPOLAR SEMICONDUCTOR DEVICE CONSTRUCTION

[75] Inventor: David E. Fulkerson, Minnetonka, Minn.

[73] Assignee: Honeywell, Inc., Minneapolis, Minn.

[22] Filed: Oct. 1, 1973

[21] Appl. No.: 402,550

[52] U.S. Cl. .................... 148/187; 148/175; 357/48

[51] Int. Cl. ................................................ H01l 7/44

[58] Field of Search .......... 148/187, 175; 317/235 E

[56] References Cited

UNITED STATES PATENTS

| | | | |
|---|---|---|---|
| 3,380,153 | 4/1968 | Husher et al. | 29/577 |
| 3,483,446 | 12/1969 | Van Der Leest | 317/235 |
| 3,547,716 | 12/1970 | De Witt et al. | 148/175 |
| 3,622,842 | 11/1971 | Oberai | 317/235 |
| 3,626,390 | 12/1971 | Chang et al. | 148/187 UX |
| 3,638,081 | 1/1972 | Lloyd | 317/235 |
| 3,667,006 | 5/1972 | Ruegg | 148/175 X |
| 3,697,337 | 10/1972 | Stehlin | 148/187 X |
| 3,702,428 | 11/1972 | Schmitz et al. | 317/235 |
| 3,725,145 | 4/1973 | Maki | 148/175 |
| 3,770,519 | 11/1973 | Wiedmann | 148/175 |

*Primary Examiner*—L. Dewayne Rutledge
*Assistant Examiner*—J. M. Davis
*Attorney, Agent, or Firm*—Theodore F. Neils

[57] ABSTRACT

A single diffusion is used to provide isolation and the base for a bipolar transistor. An improved lateral transistor and higher valued epitaxial resistors also result.

9 Claims, 3 Drawing Figures

BIPOLAR SEMICONDUCTOR DEVICE CONSTRUCTION

BACKGROUND OF THE INVENTION

This invention concerns semiconductor technology and, particularly, methods for forming isolated semiconductor component devices in integrated circuits.

The conventional methods for the making of bipolar transistors and other semiconductor component devices associated therewith are well known both for digital applications and for linear applications. Typically, a p-type conductivity substrate is provided with an $n^+$-type conductivity buried layer region diffused therein. An n-type conductivity epitaxial layer is grown over the substrate and the diffused buried layers therein. The buried layer regions in the substrate diffuse to some extent into the epitaxial layer during its growth onto the substrate. The epitaxial layer is typically 5 microns thick for digital applications and typically 12 microns thick for many linear applications requiring higher break-down voltages and only medium rapidity of operation.

Upon completion of the epitaxial layer growth, an isolation diffusion through the exterior surface of the epitaxial layer is made which goes down to the interior surface of the epitaxial layer, i.e. the surface serving as an interface between the epitaxial layer and the p-type substrate. This isolation diffusion forms several p-type conductivity isolation regions which, along with the p-type substrate, enclose portions of the epitaxial layer to form several n-type electrically isolated "islands" in the epitaxial layer. Some islands are located so that the buried layers are located in part in these islands and in part in the substrate. These islands are to have bipolar transistors formed in them. Other islands are located such that they have no buried layers in them and are to be used for forming other kinds of components therein.

Following the isolation diffusion, a base diffusion followed by an emitter diffusion are both made to form bipolar transistors as well as other kinds of semiconductor component devices.

This method is more or less in general use in providing integrated circuits for many applications. However, it would be desirable to eliminate some of the steps in this method if possible and to improve on the transistors resulting from the method for certain applications. The islands provided as a result of the isolation diffusion in the above method must be made relatively large to provide a misalignment tolerance for the subsequent base diffusion to insure that the base region resulting therefrom lies completely within the island isolated by the isolation diffusion. This relatively large island reduces the density of semiconductor component devices which can be provided in a single semiconductor device chip, i.e. a monolithic integrated circuit. Furthermore, a relatively thick epitaxial layer must be used in the above method to have the base region avoid the buried layer region. This leads to substantial lateral diffusion during the isolation diffusion resulting in relatively large isolation regions. This again reduces the component device density possible in an integrated circuit.

SUMMARY OF THE INVENTION

A method of isolation in a semiconductor layer is provided wherein the isolation diffusion through an exterior major surface of the layer is made simultaneously with what is the base diffusion in the case where a bipolar transistor is to result. This is accomplished by having the diffusion impurities intended to form base regions encounter a buried layer region or blocking region during the simultaneous diffusion through the exterior major surface and by having the diffusion impurities intended to form isolation regions avoid buried layer regions during this duffusion, instead reaching the interior major surface of the semiconductor layer. Having the isolation regions and the regions that are typically base regions formed simultaneously avoids the need for any tolerance for misalignment as needed where these are sequential diffusions. A thinner semiconductor layer is used since having such base regions encounter the buried layer region is the desired result rather than one to be avoided. This thinner layer results in less lateral diffusion occurring during the simultaneous diffusion and so in smaller isolation regions. Also, a thinner semiconductor layer results in higher values for resistors made in that layer for a given resistor area in the exterior major surface. Additionally, there is an improvement in lateral pnp transistors made simultaneously with vertical npn transistors in that the path from emitter to collector for many of the minority carriers is reduced leading to less recombination in the base region.

DESCRIPTION OF THE PREFERRED EMBODIMENTS

Figure 1:
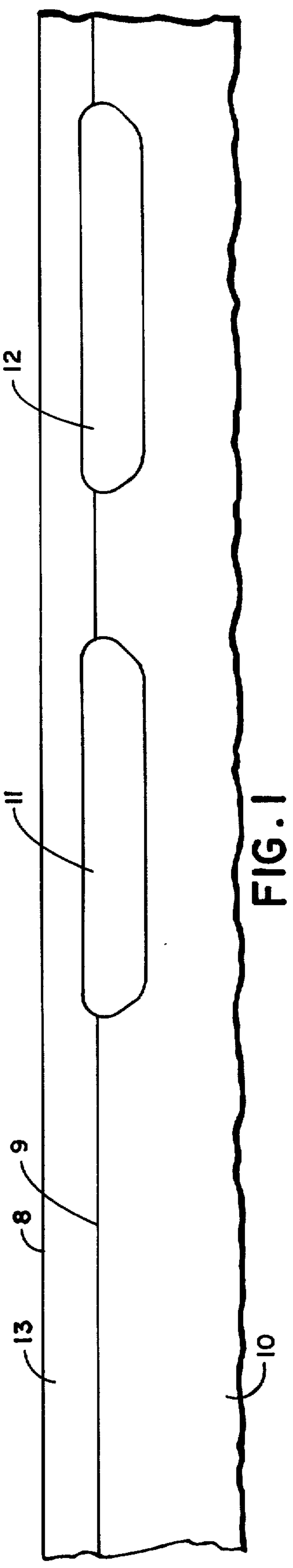
FIGS. 1 through 3 show the results of steps in the process leading to completed semiconductor devices.

FIG. 1 shows a substrate 10 of a p-type conductivity having an n-type epitaxial layer 13 grown thereon over $n^+$-type conductivity buried layer regions 11 and 12 provided earlier by a diffusion into substrate 10. No earlier p-type diffusion into substrate 10 for subsequently aiding in providing isolation regions in layer 13 is provided. Epitaxial layer 13 has an exterior major surface 8 and an interior major surface 9 where it is supported by substrate 10. The resistivity, the reciprocal of conductivity, of substrate 10 is typically 2 to 5 ohm-centimeters and the resistivity of the epitaxial layer 13 is typically of 0.1 to 10 ohm-centimeters. The resistivity of the buried layer regions 11 and 12 will be typically 30 ohms/square.

The thickness of epitaxial layer 13 in conventional processing is, as noted above, typically 5 microns in digital applications and, in linear applications where higher breakdown voltages are required without the capability of handling very high frequencies, the thickness may be typically 12 microns. For the present process, however, the thickness of epitaxial layer 13 will be typically from 1.5 to 3 microns for digital applications and, in special linear applications where the low breakdown voltage inherent in the transistors resulting from this process is not a problem, the thickness of epitaxial layer 13 may be from 2 to 4 microns.

Figure 2:
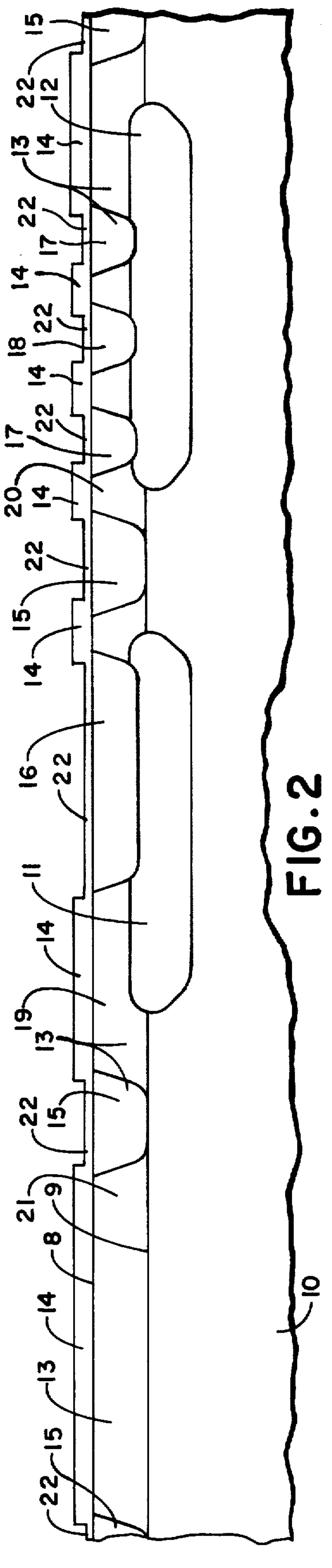

Upon completion of epitaxial layer 13, a silicon dioxide layer is provided over the epitaxial layer and openings are provided therein for a simultaneous isolation and active region diffusion, the active region diffusion portion being typically a diffusion providing for transistor bases and so can be called a base diffusion. FIG. 2 shows the results of this diffusion and shows the silicon dioxide layer regions remaining after both the openings have been provided and the diffusion has occurred. These silicon dioxide regions remaining are labeled 14 in this Figure.

The simultaneous isolation and base diffusion of impurities leading to p-type conductivity results in several isolation regions all labeled 15 in FIG. 2. These isolation regions are suitably interconnected when viewed in exterior major surface 8 to form isolated n-type regions or "islands" 19, 20 and 21 in epitaxial layer 13. This diffusion also provides a semiconductor device component active region 16, which can be a base region for a bipolar npn vertical transistor for instance or can be one side of a diode, in isolated region or island 19. This island has active region 16 contained therein such that region 16 is enclosed by isolation region 15 when viewed in exterior major surface 8. Further, the simultaneous isolation and base diffusion provides collector region 17 and emitter region 18 for a bipolar pnp lateral transistor in isolated region 20. Finally, isolated region 21 is provided without any portion of any buried layer located within it. An epitaxial resistor can be provided in this last isolated region. The resistivity of each of the p-type conductivity regions provided by the simultaneous isolation and base diffusion will be typically 150 ohms/square. An oxide layer 22 forms in the openings provided in the silicon dioxide layer to accommodate the simultaneous diffusion as a result of the diffusion process.

Active region 16, to be hereinafter a base region, collector region 17 and emitter region 18 would all have diffused through epitaxial layer 13 to interior major surface 9 in the manner of isolation regions 15 were it not for the diffusion of the impurities forming these regions encountering buried layers 11 and 12. These encounters of selected portions of the diffusion impurities occurring in the simultaneous diffusion make possible the result of forming isolated regions simultaneously with semiconductor component device regions intended for circuit component use in the integrated circuit. Base region 16 does not penetrate through epitaxial layer 13 as do the isolation regions 15 because of the considerably higher doping level existing in epitaxial layer 13. The buried layer region 11 cannot be converted to p-type conductivity anywhere near as rapidly by the diffusion of p-type impurities into this region as can epitaxial layer 13, at locations where no buried layer occurs, by diffusion of p-type impurities therein. The same situation is true of collector region 17 and emitter region 18 with respect to buried layer region 12. Thus, buried layer regions 11 and 12 serve as blocking regions for selected portions of the simultaneous isolation and base diffusion.

As it is intended that the diffusion of base region 16 and the diffusion of collector region 17 and of emitter region 18 encounter buried layer regions, there is no need to provide a thick epitaxial layer 13 to prevent contact between base region 16 and buried layer region 11, on the one hand, and between collector region 17, emitter region 18 and buried layer region 12, on the other hand, since such contact is intended to result. With a thinner epitaxial layer 13 the p-type impurity diffusion need not continue so long to effect penetration of the epitaxial layer 13. Shortening the time of p-type impurity diffusion means there will also be less lateral diffusion by the p-type impurities making possible narrower isolation regions 15.

With the isolation regions 15 formed at the same time that base region 16, collector region 17 and emitter region 18 are formed, there need be no misalignment tolerance allowed as in processes forming the isolation regions prior to these other regions. Thus, semiconductor component devices taking small areas in the exterior major surface 8 of epitaxial layer 13 can be made.

An additional advantage of the use of a thin epitaxial layer results from the larger valued epitaxial resistors which can be formed due to the smaller cross-sectional area of such resistors when formed. Thus, isolated region 21, being thinner than it would be in conventional processing, can provide a given resistance while using less area in the exterior major surface 8 of epitaxial layer 13 than would be the case in conventional processing.

An improvement in performance of the lateral transistor located in isolated region 20 also results. Minority carriers ejected from emitter region 18 into epitaxial layer 13, serving as the transistor base, travel to collector region 17 during transistor operation. Those minority carriers which are injected at the bottom face of emitter region 18 would tend to travel a relatively long route to collector region 17 in the absence of buried layer region 12 thereby leading to a relatively large amount of recombination in the base region. The high doping level of buried layer region 12, however, will act to reduce the injection of minority carriers from emitter region 18 into the region occupied by buried layer 12. As a result, most of the injection of minority carriers from emitter region 18 will be into isolated region 20 in those portions thereof located immediately between emitter region 18 and collector region 17. These portions of isolated region 20 include only the shorter paths between emitter region 18 and collector region 17 resulting in minimal travel for the injected minority carriers enroute to collector region 17. Such minimal travel reduces the chances for recombination in these portions of isolated region 20, i.e. the base of the lateral pnp transistor. This improves the gain of the lateral transistor.

Against the above advantages, there are some disadvantages for general purpose use in having base layer 16 in contact with buried layer region 11. These disadvantages are a relatively low break-down voltage and an increased collector-to-base capacitance meaning slower transistor operation. In digital applications rather low supply voltages are used in any case so that the resulting lower break-down voltage in vertical bipolar transistors resulting from the above described process is not crtical. Therefore, those digital applications requiring logic gates which respond with only a medium rapidity but where a high density of bipolar devices is desired are applications suitable for the transistors resulting from this process. Such applications might be for logic gates in many kinds of computers and controls and for semiconductor memories. Certain low voltage, high density special linear applications can also be met by the vertical bipolar transistors resulting from this process. The availability of a better lateral pnp and higher valued epitaxial resistors can be quite beneficial in both these linear and in digital applications.

Figure 3:
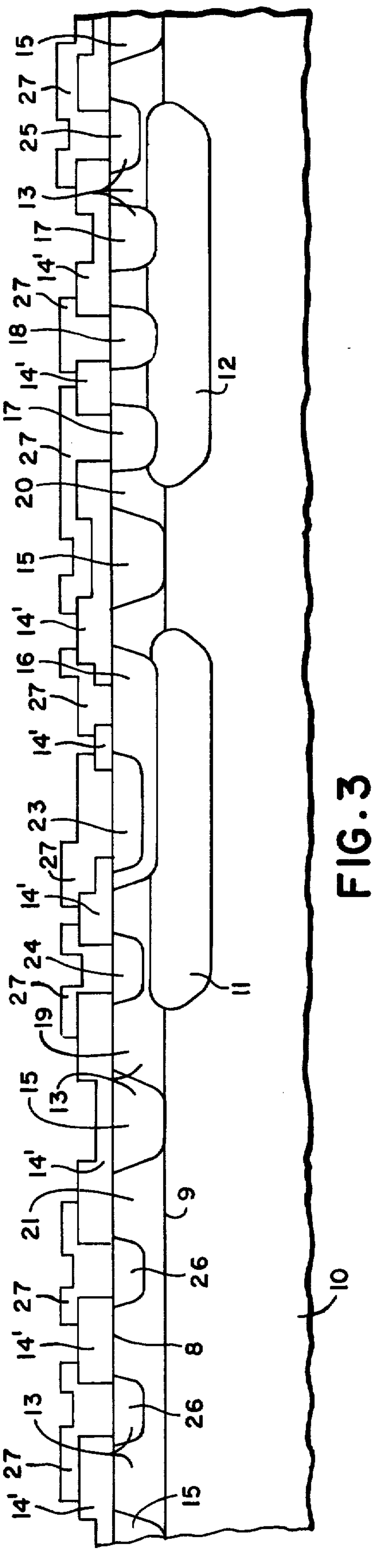

At the completion of the p-type impurity diffusion, a silicon dioxide layer is deposited over the remaining silicon dioxide layer regions 14 and over the silicon dioxide portions 22 in the openings for the simultaneous diffusion. Openings are made in the resulting silicon dioxide layer to permit an n-type impurity diffusion. Resulting silicon dioxide regions 14' are shown in FIG. 3 after the n-type impurity diffusion has taken place and after metallization. The n-type impurity diffusion simultaneously provides another active region 23 contained in base region 16, collector contact region 24, base contact region 25 and resistor contact regions 26. The resistivity of these regions would typically be 5 ohms/square. Omitting provision of active region 23, here an emitter region, in the diffusion can provide a diode or a photodiode in isolated region 19. Of course, when region 23 is provided it can serve as part of a diode by suitable metallization interconnection.

Metallization of the wafer with the epitaxial layer on it provides contacts to the various semiconductor devices formed therein. The metallization contacts and pathways are labeled 27 in FIG. 3. This completes the formation of the semiconductor component devices for a monolithic integrated circuit, these being in FIG. 3 a bipolar npn vertical transistor in isolated region 19, a bipolar pnp lateral transistor in isolated region 20 and an epitaxial resistor in isolated region 21.

The semiconductor component devices shown in FIG. 3 can be provided in many combinations to form useful semiconductor devices. Other semiconductor component devices, not shown in FIG. 3, clearly can also be added by choice using the above described method in making such devices.

The embodiments of the invention in which an exclusive property or right is claimed are defined as follows:

1. A method for providing a semiconductor device, said method comprising:

providing a semiconductor layer on a substrate, said semiconductor layer being of a first conductivity type having a first conductivity and further having an exterior major surface opposite an interior major surface thereof, said substrate with said semiconductor layer thereon having a first blocking region, of said first conductivity type with a second conductivity, located at least in part in said semiconductor layer and without said substrate with said semiconductor layer thereon having a region of a second conductivity type provided therein prior to said providing of said semiconductor layer for aiding in providing a first isolation region;

diffusing simultaneously a first active region and said first isolation region, both of said second conductivity type, into said semiconductor layer through said exterior major surface so said diffusing of said first isolation region occurs such that said first isolation region reaches said interior major surface and so said diffusing of said first active region occurs such that said first active region encounters said first blocking region before reaching said interior major surface, said first active region being enclosed by said first isolation region in said exterior major surface; and diffusing a second active region of said first conductivity type into said first active region through said exterior major surface, such that said second active region is sufficiently close to said first blocking region and such that said first active region has a diffusant concentration of such a value that a bipolar transistor having a substantial current gain results with said first active region serving as a base and said second active region serving as an emitter.

2. The method of claim 1 wherein said semiconductor device also has a second blocking region of said first conductivity type having approximately said second conductivity, said second blocking region located at least in part in said semiconductor layer but without intersecting said first blocking region, and wherein said diffusing of said first active region and said first isolation region is accompanied by simultaneously diffusing a second isolation region, an emitter region and a collector region, all of said second conductivity type, into said semiconductor layer through said exterior major surface with said diffusing of said collector region and of said emitter region positioned to encounter said second blocking region before reaching said interior major surface without encountering one another, said collector region and said emitter region being enclosed by said second isolation region in said exterior major surface.

3. The method of claim 1 wherein said diffusing of said first active region and said first isolation region is accompanied by simultaneously diffusing a second isolation region of said second conductivity type into said semiconductor layer through said exterior major surface.

4. The method of claim 1 wherein said diffusing of said second active region is accompanied by simultaneously diffusing a contact region of said first conductivity type into said semiconductor layer through said exterior major surface, said contact region being enclosed by said first isolation region in said exterior major surface.

5. The method of claim 2 wherein said diffusing of said first active region and said first isolation region is accompanied by simultaneously diffusing a third isolation region of said second conductivity type into said semiconductor layer through said exterior major surface.

6. The method of claim 2 wherein said diffusing of said second active region is accompanied by simultaneously diffusing a first contact region of said first conductivity type into said semiconductor layer through said exterior major surface near said collector region, said first contact region being enclosed by said second isolation region in said exterior major surface; and is further accompanied by simultaneously diffusing a second contact region of said first conductivity type into said semiconductor layer through said exterior major surface, said second contact region being enclosed by said first isolation region in said exterior major surface.

7. The method of claim 3 wherein said diffusing of said second active region is accompanied by simultaneously diffusing first and second resistor contact regions of said first conductivity type into said semiconductor layer through said exterior major surface, said first and second resistor contact regions being both enclosed by said second isolation region in said exterior major surface.

8. The method of claim 3 wherein said diffusing of said first active region and said first isolation region is accompanied by diffusing a third active region of said second conductivity type into said semiconductor layer through said exterior major surface, said third active region being enclosed by said second isolation region.

9. The method of claim 5 wherein said diffusing of said second active region is accompanied by simultaneously diffusing first and second resistor contact regions of said first conductivity type into said semiconductor layer through said exterior major surface, said first and second resistor contacts being both enclosed by said third isolation region in said exterior major surface.

* * * * *